United States Patent [19]
Wada

[11] Patent Number: 5,293,611
[45] Date of Patent: Mar. 8, 1994

[54] DIGITAL SIGNAL PROCESSOR UTILIZING A MULTIPLY-AND-ADD FUNCTION FOR DIGITAL FILTER REALIZATION

[75] Inventor: Hirofumi Wada, Tokyo, Japan

[73] Assignee: Hitachi, Ltd., Tokyo, Japan

[21] Appl. No.: 728,826

[22] Filed: Jul. 9, 1991

Related U.S. Application Data

[63] Continuation of Ser. No. 409,881, Sep. 19, 1989, abandoned.

[30] Foreign Application Priority Data

Sep. 20, 1988 [JP] Japan .................. 63-236088

[51] Int. Cl.⁵ .......................................... G06F 15/31
[52] U.S. Cl. ............................... 395/425; 364/724.16
[58] Field of Search ............. 364/200, 900, 724.13, 364/724.16, 736, 11.16; 395/425

[56] References Cited

U.S. PATENT DOCUMENTS

| | | | |
|---|---|---|---|
| 3,665,413 | 5/1972 | Walsh et al. | 364/900 |
| 3,717,756 | 2/1973 | Stitt | 364/724.16 |
| 3,778,778 | 12/1973 | Ragan | 364/200 |
| 4,159,535 | 6/1979 | Fuhrman | 364/900 |
| 4,323,980 | 4/1982 | Houdond et al. | 364/724.13 |
| 4,541,076 | 9/1985 | Bower et al. | 365/190 |
| 4,701,873 | 10/1987 | Schenk | 364/724.16 |
| 4,706,188 | 11/1987 | Rainer et al. | 364/200 |
| 4,736,414 | 4/1988 | Montagna | 364/724.16 |
| 4,771,395 | 9/1988 | Watanabe | 364/724.16 |
| 4,791,596 | 12/1988 | Harbich | 364/724.16 |
| 4,823,321 | 4/1989 | Aoyama | 365/189 |
| 4,837,844 | 6/1989 | Urushibata | 364/900 |
| 4,853,890 | 8/1989 | Abe et al. | 364/900 |
| 4,928,238 | 5/1990 | Sekiguchi | 364/736 |
| 4,939,684 | 7/1990 | Gehrig et al. | 364/724.01 |
| 4,964,046 | 10/1990 | Mehrgadt et al. | 364/200 |

OTHER PUBLICATIONS

"Users' Manual of Hitachi Digital Signal Processor (HSP) HD61810" issued in Sep., 1985 by Hitachi, Ltd.

*Primary Examiner*—Arthur G. Evans
*Assistant Examiner*—C. Shin
*Attorney, Agent, or Firm*—Fay, Sharpe, Beall, Fagan, Minnich & McKee

[57] ABSTRACT

A digital signal processor with a built-in dual-port RAM and a bypass signal path for transferring data without the intervention of any bus which is extended between the two ports of the data RAM, whereby in the course of multiply-and-add processing necessary for filter processing, sampling data items to be read out of a predetermined address of the data RAM can be transmitted to an internal bus and can simultaneously be written into the next address of the data RAM to be shifted thereto, in one memory cycle of the data RAM.

11 Claims, 10 Drawing Sheets

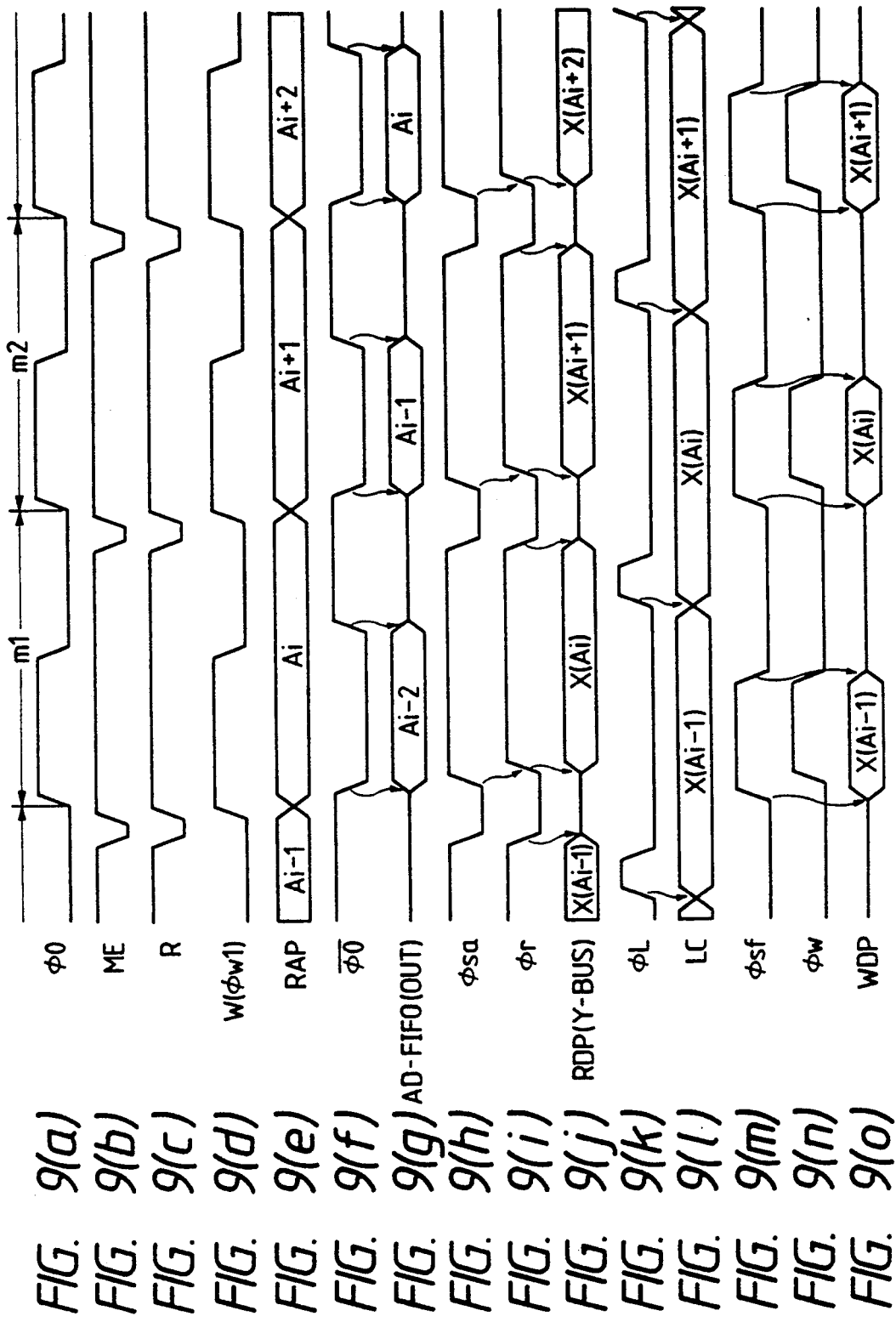

DIGITAL SIGNAL PROCESSOR UTILIZING A MULTIPLY-AND-ADD FUNCTION FOR DIGITAL FILTER REALIZATION

This is a continuation of copending application Ser. No. 07/409,881 filed on Sep. 19, 1989 now abandoned.

BACKGROUND OF THE INVENTION

The present invention relates to a digital signal processor. More particularly, it relates to techniques which are especially effective for use in a digital signal processor having a multiply-and-add function necessary for digital filter realization.

Digital signal processors having a multiply-and-add function necessary for so-called filter processing for the realization of a digital filter are well known. The digital signal processors adopt a stored program system employing microprograms and include therein an instruction ROM (read only memory) for storing microinstructions, and a data ROM as well as a data RAM (random access memory) for storing processing and other data.

A digital signal processor having the multiply-and-add function is described in "Users' Manual of Hitachi Digital Signal Processor (HSP) HD61810" issued in September 1985 by Hitachi, Ltd.

FIG. 10 shows a partial block diagram of the digital signal processor described in the above literature. In addition, FIG. 11 is an example of a processing flow diagram in the case where a transversal type digital filter is equivalently realized in the digital signal processor of FIG. 10.

Referring to FIGS. 10 and 11, sampling data items $X_1$–$X_n$, which are formed in such a way that an input analog signal is sampled at a predetermined period and then digitized, are temporarily stored in the corresponding addresses of a data RAM represented by symbol DRAM. The sampling data items are read out of the DRAM successively as sampling data items $X_i$, and they are input to a multiplier unit MULT together with filter coefficients $C_i$ which are read out of the corresponding addresses of a data ROM represented by symbol DROM. The results (products) of the multiplier unit MULT are further input to an arithmetic logic unit ALU, in which they are added with the output signals of accumulators ACCA and ACCB which contain the last added result (sum) of the arithmetic logic unit ALU.

The sampling data items $X_i$ read out of the DRAM are held for one machine cycle by a delay register DREG comprising two stages of latches. The held data items $X_i$ are input to the addresses $A_{i+1}$ of the DRAM after the read operation of the next sampling data items $X_{i+1}$. Consequently, the sampling data items $X_1$–$X_n$ are, in effect, delayed for one sampling period and are successively shifted within the DRAM.

In this manner, the sampling data items $X_i$ and the filter coefficients $C_i$ are successively input to the MULT, and the sampling data items $X_i$ are successively shifted within the DRAM, whereby the following multiply-and-add processing necessary for digital filter implementation as illustrated in FIG. 11 is executed:

$$Q_n \sum_{i=1}^{n} X_i \cdot C_i$$

thus realizing the equivalent digital filter.

Limitations exist in the digital signal processor referred to above. DRAM is constructed of a single-port RAM, the sampling data items $X_i$ held in the delay register DREG are written into the addresses $A_{i+1}$ of the DRAM after the read operation of the next sampling data items $X_{i+1}$ has ended. Because of this, the read operation and the write operation must be performed in a time-division fashion within one memory cycle of the DRAM, so that the potential levels of each data line and each sense amplifier in the DRAM change twice within one memory cycle. This leads to the problem that the overall access time required increases as the DRAM size increases. The result thus places a limit on the shortening of the machine cycle of the digital signal processor.

SUMMARY OF THE INVENTION

An object of the present invention is to provide a digital signal processor which can attain a faster machine cycle speed.

The aforementioned and other objects and novel features of the present invention will become apparent from the description of this specification when read in conjunction with the accompanying drawings.

Typical aspects of performance of the present invention are briefly summarized below. The DRAM of the digital signal processor is constructed with a dual-port RAM design. Also, a bypass signal path for transferring data without the intervention of a bus is provided between the two ports of the DRAM. In the course of multiply-and-add computations necessary for filter processing, sampling data read out of the predetermined address of the DRAM is transmitted to the bus and is simultaneously written into the next address of the DRAM to which the sampling data is to be shifted.

According to the expedient described above, the read operation of the sampling data required for the multiply-and-add processing and the write operation required for the shift thereof can be performed simultaneously in one memory cycle without changing the potential level of each data line, so that the multiply-and-add computations necessary for the filter processing can be repeated at high speed. It is therefore possible to shorten the machine cycle of the digital signal processor of the present invention.

BRIEF DESCRIPTION OF THE DRAWINGS

FIGS. 9(a)-9(o) are timing charts exemplifying the operation of the digital signal processor DSP1 shown in FIG. 6;

DESCRIPTION OF THE PREFERRED EMBODIMENTS

In the ensuing description, unless otherwise specified, parts with the same symbols assigned thereto shall be identical or equivalent to one another.

Figure 1:
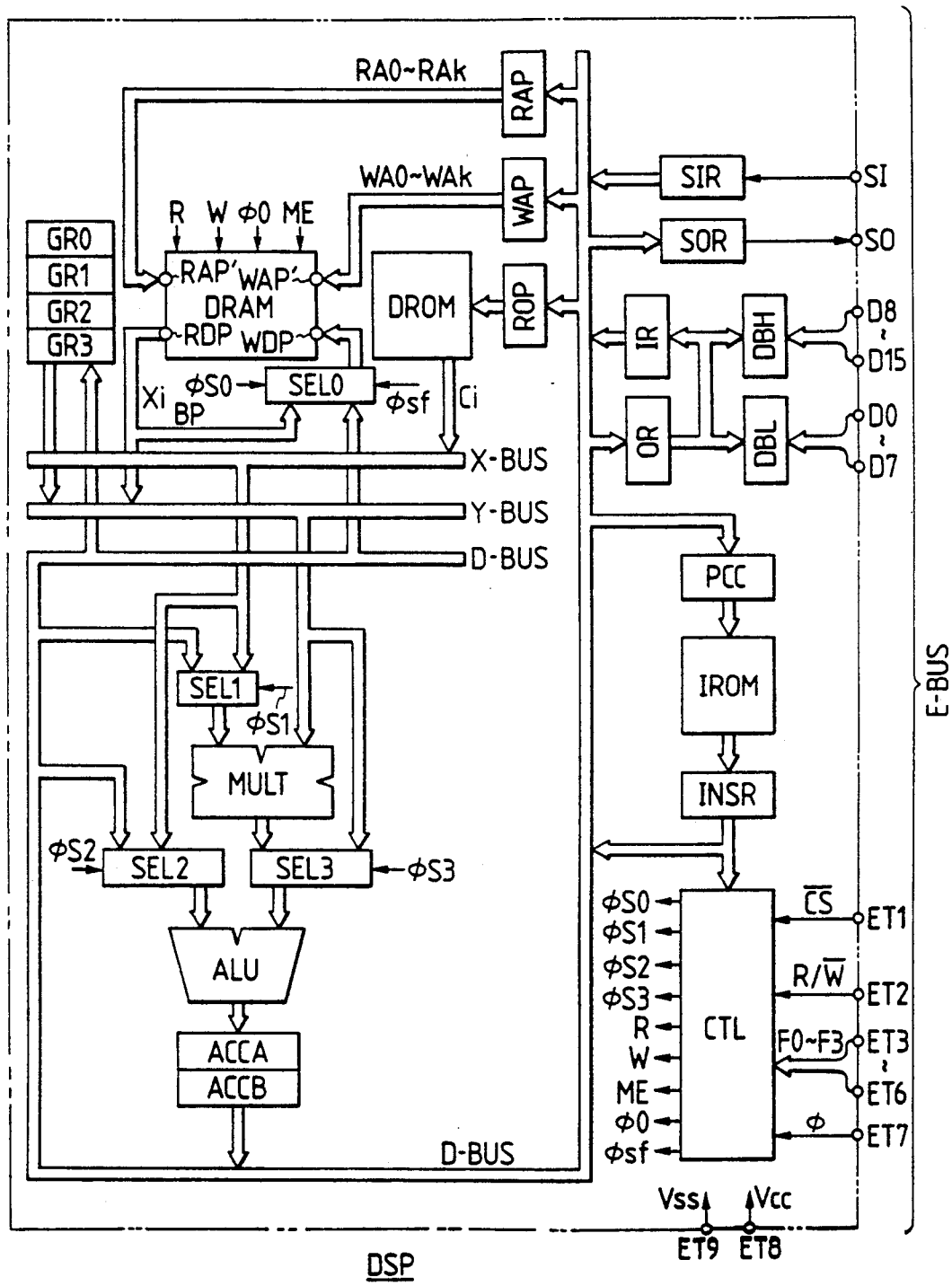
FIG. 1 is a block diagram showing the first embodiment of the digital signal processor of the present invention.

FIG. 1 shows a block diagram of the first embodiment of a digital signal processor to which the present invention is applied. Although not especially restricted, circuit elements constituting various circuit blocks in the Figure are formed on a single semiconductor substrate such as of single-crystal silicon by known techniques for manufacturing semiconductor integrated circuits.

Although no special limitation is intended, the digital signal processor DSP of this embodiment is a signal processor based on a stored program system employing microprograms. The operation thereof is generally controlled by microinstructions which are stored in an instruction ROM IROM built in the DSP.

Although not especially limited, the digital signal processor DSP of this embodiment includes the instruction ROM IROM, a data RAM DRAM, a data ROM DROM, a multiplier unit MULT, an arithmetic logic unit ALU, accumulators ACCA and ACCB, general-purpose registers GR0-GR3, a read address pointer RAP, a write address pointer WAP, a ROM address pointer ROP, a controller CTL, a program counter PCC, an instruction register INSR, an input register IR, an output register OR, data buffers DBH and DBL, a serial input register SIR, a serial output register SOR, selectors SEL0-SEL3, a data bus D-BUS configured of 16 bits, an X-bus X-BUS configured of 16 bits, a Y-bus Y-BUS configured of 16 bits, a bypass signal path BP configured of 16 bits, and external terminals SI, SO, D0-D15 and ET1-ET9.

In the architecture of FIG. 1, the DRAM temporarily stores sampling data. In this embodiment, the DRAM is a dual-port RAM, having two data ports and two address ports. In addition, the operation of the DRAM is controlled by a read control signal R, a write control signal W, a memory enable signal ME and a basic clock signal $\phi 0$ which are supplied from the controller CTL.

Although not especially limited, the two data ports are separately dedicated to a read data port RDP and a write data port WDP. A bypass signal path BP, is provided between the read data port RDP and the write data port WDP.

Although not especially limited, the two address ports are constructed of a read address port RAP' and a write address port WAP'. The RAP' receives address signals $RA_0$-$RA_k$ indicative of the locations of read data to be output from the read data port RDP. The WAP' receives write address signals $WA_0$-$WA_k$ indicative of the locations of write data to be input from the data port WDP. In this regard, the address signals $RA_0$-$RA_k$ for the read address port RAP' are supplied by the read address pointer RAP, and the address signals $WA_0$-$WA_k$ for the write address port WAP' are supplied by the write address pointer WAP. The address pointers RAP and WAP have the ability to autonomously increment their contents, and their initial values are set through the data bus D-BUS.

Although not especially limited, the sampling data items $X_i$ read from the read data port RDP of the DRAM are supplied to an input terminal of the multiplier unit MULT through the Y-BUS or to an input terminal of the arithmetic logic unit ALU through the Y-BUS via selector SEL3. In addition, the sampling data items $X_i$ are transmitted to the write data port WDP of the DRAM through the bypass signal path BP and selector SEL0, when necessary for filter processing by the DSP. Ordinary write data items for the DRAM are supplied to the write data port WDP thereof through the D-BUS via the selector SEL0. The DRAM can independently and simultaneously write the data items to be output to the read data port RDP and read the data items to be input from the write data port WDP, from and into any desired address, respectively. Thus, the read operation of the sampling data items necessary for the multiply-and-add processing and the write operation necessary for shifting the sampling data items (hereinbelow, this write operation shall be termed the "shift write operation") can be simultaneously executed in one memory cycle.

The DROM stores fixed data such as filter coefficients. Although not especially limited, the DROM is constructed of read only memory such as masked ROM, and the addresses thereof are designated by the ROM address pointer ROP. Like the read address pointer RAP and the write address pointer WAP, the ROM address pointer ROP has the ability to autonomously increment its contents and its initial value is set through the D-BUS.

Although not especially limited, the filter coefficients $C_i$ read from the DROM are supplied to either an input terminal of the multiplier unit MULT through the X-BUS and selector SEL1 or to an input terminal of the arithmetic logic unit ALU through the X-BUS and selector SEL2.

The selector SEL0 selects either the write data of the DRAM on the data bus D-BUS or the read data of the DRAM on the bypass signal path BP and supplies the selected data to the write data port WDP on the basis of a control signal $\phi S0$ and a shift control signal $\phi Sf$ from the controller CTL. The selector SEL1 selects either data on the X-BUS (for example, the read data of the DROM) or data on the data bus D-BUS (for example, the output signals of the accumulators ACCA and ACCB) and supplies the selected data to the multiplier unit MULT on the basis of a control signal $\phi S1$ from the controller CTL. The selector SEL2 selects either data on the D-BUS (for example, the output signals of the accumulators ACCA and ACCB) or data on the X-BUS (for example, the read data of the DROM) and supplies the selected data to the arithmetic logic unit ALU on the basis of a control signal $\phi S2$ from the controller CTL. The selector SEL3 selects either the data of the processed result of the multiplier unit MULT or the data on the Y-BUS (for example, the read data of the DRAM) and supplies the selected data to the arithmetic logic unit ALU on the basis of control signal $\phi S3$ from the controller CTL.

Although no special limitation is intended, the output terminals of the general-purpose registers GR0-GR3 are connected to the Y-BUS. These general-purpose registers GR0-GR3 are used as working registers, and their input terminals are coupled to the D-BUS.

As stated before, one input terminal of the multiplier unit MULT is supplied by the Y-BUS with the sampling data items $X_i$ which are output from the DRAM, while the other input terminal of the multiplier unit MULT is supplied by the X-BUS via the selector SEL1 with the filter coefficients $C_i$ which are output from the DROM. Depending upon the desired computation, an input terminal of the multiplier unit MULT is supplied with the data on the data bus D-BUS (the output signals of the accumulators ACCA and ACCB or input data from an external device) via the selector SEL1. The multiplier unit MULT multiplies the two sets of the supplied data items, and supplies the results to an input terminal of the arithmetic logic unit ALU via the selector SEL3.

As stated above, an input terminal of the arithmetic logic unit ALU is supplied with the multiplied results of the multiplier unit MULT through the selector SEL3. It is also possible for the ALU to process read data items obtained from the DRAM directly through selector SEL3. Although not especially limited, the other input terminal of the arithmetic logic unit ALU is supplied with the output signals of the accumulators ACCA and ACCB through the D-BUS via selector SEL2.

When the multiply-and-add calculation necessary for the filter processing is executed in the digital signal processor DSP, the accumulators ACCA and ACCB hold the results of the previous multiply-and-add operations. Depending upon the desired ALU process, an input terminal may be supplied with the read data items of the DROM directly through the X-BUS via the selector SEL2.

The ALU executes various kinds of processing, including additions, between the two sets of the supplied data items, and sends the results to the accumulators ACCA and ACCB. The ALU can also supply the accumulators ACCA and ACCB with the multiplied results of the multiplier unit MULT as left intact without subjecting them to any further processing, in accordance with the desired process.

In the digital signal processor of the present invention, the multiplier unit MULT is successively supplied with sampling data items $X_i$ from the DRAM and filter coefficients $C_i$ from the DROM. Similarly, the arithmetic logic unit ALU is successively supplied with the results of the multiplication performed in the multiplier unit MULT and with the results from prior cycles contained in the accumulators ACCA and ACCB. Thus, the multiplier unit MULT and the arithmetic logic unit ALU function to execute the steps of the multiply-and-add process to equivalently realize a digital filter, in one machine cycle.

Although not especially limited, the instruction ROM IROM is constructed of a programmable ROM, the addresses of which are designated by the program counter PCC. The PCC is independently incremented to direct the program flow. The initial value of the PCC is set by signals transmitted through the external terminals D0-D15, input/output buffers DBH and DBL, input register IR and data bus D-BUS.

Microinstructions are read from the IROM to the instruction register INSR. The microinstructions held there are supplied to the controller CTL, and some are directly supplied to the corresponding circuits of the digital signal processor DSP.

The controller CTL receives certain microinstructions held in the instruction register INSR, and decodes them by means of a plurality of internal decoders thereby forming the timing signals and various control signals R, W, ME, $\phi S0-\phi S3$, $\phi Sf$, etc. which are needed by the internal circuits of the digital signal processor DSP. Thus, various microinstruction operations are executed in the respective circuits of the digital signal processor DSP. The controller CTL is supplied through the external terminals ET1, ET2, and ET3--ET6 with a chip select signal CS, a read/write signal R/W, and function code signals F0-F3 respectively. These signals are applied as external control signals from other devices connected to the DSP and control input/output operations for the various registers and pointers, etc. The controller CTL forms the basic clock signals for the internal circuits on the basis of a clock signal $\phi$ which is supplied from an externally-connected device through the external terminal ET7.

The digital signal processor DSP has the ability to receive and deliver data in parallel form through the input register IR or the output register OR. The DSP can also receive or deliver data serially through the serial input register SIR or the serial output register SOR.

The input register IR receives parallel input data items from an external device through the external terminals D0-D15 coupled to the data input/output lines of the external bus E-BUS and the data buffers DBH and DBL. The input register holds the input data items therein, and transmits them to the internal data bus D-BUS. In addition, the output register OR receives output data items through the internal data bus D-BUS. The output register holds the output data items therein, and transmits them in parallel to the external device through the data buffers DBH and DBL and the external terminals D0-D15 which are coupled to the data input/output lines of the external bus E-BUS. The serial input register SIR receives serial input data items from an external device through the external terminal SI coupled to the serial input line of the external bus E-BUS in accordance with a clock signal not shown. The input data items are then transmitted in parallel to the internal data bus D-BUS. The serial output register SOR accepts output data items which are supplied in parallel through the internal data bus D-BUS. The SOR holds the output data items therein, and serially transmits them to an external device through the external terminal SO coupled to the serial output line of the E-BUS in accordance with a clock signal not shown.

Further, the internal circuits in the digital signal processor DSP are supplied with a power source voltage $V_{CC}$ and a ground potential $V_{SS}$ through the respective external terminals ET8 ad ET9.

Figure 2:
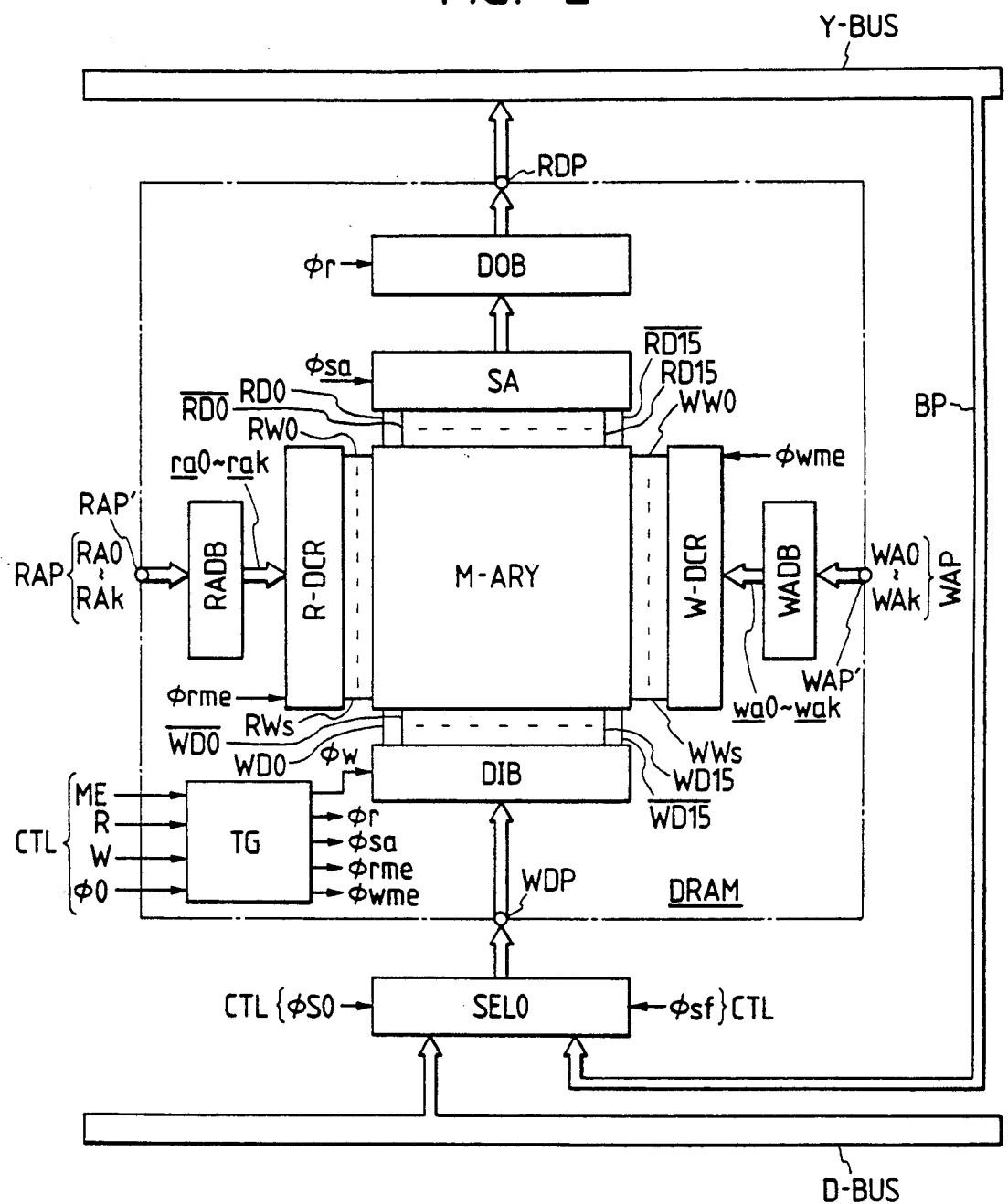
FIG. 2 is a block diagram showing an example of a DRAM which is built in the digital signal processor DSP of FIG. 1.
Figure 3:
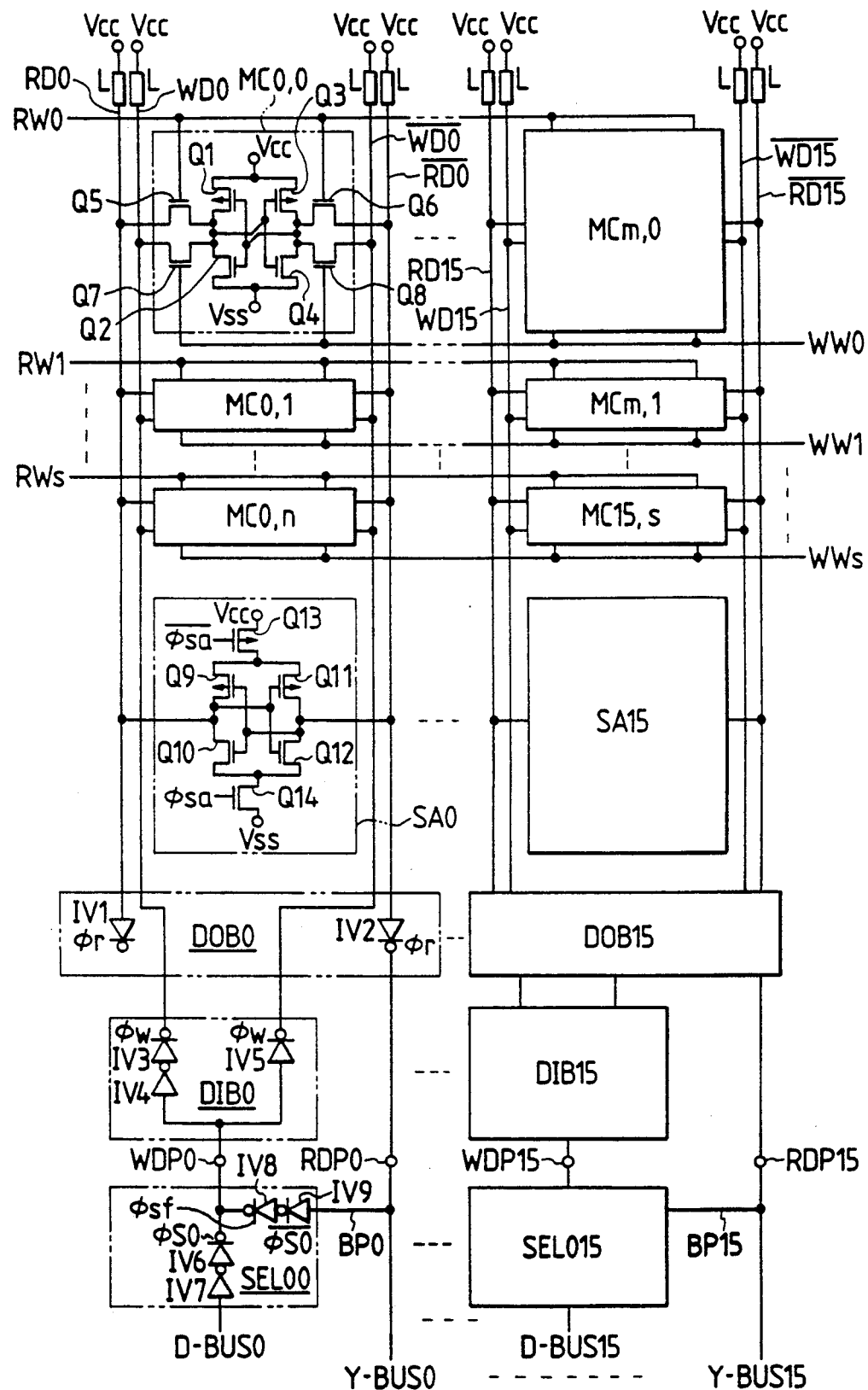
FIG. 3 is a detailed diagram exemplifying a memory array M-ARY, a sense amplifier SA, a data input buffer DIB, a data output buffer DOB and a selector SEL0 which are included in the DRAM of FIG. 2.

FIG. 2 shows a block diagram of an example of the DRAM of the digital signal processor DSP of FIG. 1. FIG. 3 shows a detailed diagram exemplifying a memory array M-ARY, a sense amplifier SA, a data input buffer DIB, a data output buffer DOB and the selector SEL0.

Referring to FIG. 2, the DRAM of this example operates according to the basic clock signal $\phi 0$ supplied from the controller CTL. The memory cycle is thus determined by this basic clock signal $\phi 0$. When the memory enable signal ME is set to a high level before the rise of the basic clock signal $\phi 0$, the DRAM is brought into its enabled state for a fixed time interval within the next memory cycle. In addition, the read and write operations of the DRAM are controlled by the read control signal R and the write control signal W which originate from the controller CTL. When the read control signal R is at its high level at the rise of the basic clock signal $\phi 0$ under the enabled state of the DRAM, the DRAM enters into its read state for a predetermined time interval. On the other hand, when the write control signal W is at its high level at the rise or fall of the basic clock signal $\phi 0$ under the enabled state of the DRAM, the DRAM enters into its write state for a predetermined time interval.

Although not especially limited, the DRAM is comprised of a read address buffer RADB, a read decoder R-DCR, a write address buffer WADB, a write decoder W-DCR, a memory array M-ARY, a sense amplifier SA, a data input buffer DIB, a data output buffer DOB, a timing generator TG, a read address port RAP', a write address port WAP', a read data port RDP and a write data port WDP. The read and write address ports RAP' and WAP' are each configured with k+1 unit address ports to correspond with the address signals $RA_0$-$RA_k$ and $WA_0$-$WA_k$ though they are not shown in the drawing. As will be described in detail later with reference to FIG. 3, since the DRAM has a 16 bit input/output construction, the read and write data ports are similarly configured with 16 unit read and write data ports.

As will be detailed later with reference to FIG. 3, the memory array M-ARY is configured with a plurality of read word lines $RW_0$-$RW_S$ and a plurality of write word lines $WW_0$-$WW_S$ which appear in the horizontal direction as viewed in the Figure. The memory array M-ARY also contains a plurality of pairs of read data lines $RD_0$, $\overline{RD_0}$-$RD_{15}$, $\overline{RD_{15}}$ and a plurality of pairs of write data lines $WD_0$, $\overline{WD_0}$-$WD_{15}$, $\overline{WD_{15}}$ which appear in the vertical direction, and a plurality of memory cells which are arranged at the lattice intersection points between the read and write word lines and the read and write data lines.

Upon receiving the address signals $RA_0$-$RA_k$ supplied from the read address pointer RAP, the read address buffer RADB forms complementary internal address signals $ra_0$-$ra_k$ and outputs them to the read decoder R-DCR. (Hereinafter, noninverted internal address signals $ra_0$-$ra_k$ and inverted address signals $\overline{ra_0}$-$\overline{ra_k}$ shall be expressed as the complementary internal address signals $ra_0$-$ra_k$).

The read decoder R-DCR is supplied with a timing signal $\phi rme$ and the complementary internal address signals $ra_0$-$ra_k$. Based upon the complementary internal address signals $ra_0$-$ra_k$, the read decoder R-DCR selects one of the read word lines $RW_0$-$RW_S$ by raising the selected line to its high level. The remaining read word lines remain in their unselected states, that is in a low level, for the time interval during which the timing signal $\phi rme$ remains high. When the DRAM is in the read state, the timing signal $\phi rme$ is held at the high level for a predetermined time interval during one memory cycle.

Upon receiving the address signals $WA_0$-$WA_k$ supplied from the write address pointer WAP, the write address buffer WADB forms complementary internal address signals $wa_0$-$wa_k$ and outputs them to the write decoder W-DCR.

The write decoder W-DCR is supplied with a timing signal $\phi wme$ and the complementary internal address signals $wa_0$-$wa_k$. Based upon the complementary internal address signals $wa_0$-$wa_k$, the write decoder W-DCR selects one of the write word lines $WW_0$-$WW_S$ by raising the selected line to its high level. The remaining write word lines remain in their unselected states, that is in a low level for the time interval during which the timing signal $\phi wme$ remains high. When the DRAM is in the write state, the timing signal $\phi wme$ is held at the high level for a predetermined time interval within one memory cycle.

The sense amplifier SA is comprised of 16 unit sense amplifier circuits which are coupled with the plurality of corresponding pairs of read data lines $RD_0$, $\overline{RD_0}$-$RD_{15}$, $\overline{RD_{15}}$. The sense amplifier SA is supplied with a timing signal $\phi sa$ from the timing generator TG which selectively enables and disables the SA thereby amplifying read signals which are output from a plurality of memory cells coupled to the selected read word line, through the corresponding pairs of read data lines.

The data output buffer DOB is configured with 16 unit data output buffer circuits which are coupled to a corresponding plurality of pairs of read data lines $RD_0$, $\overline{RD_0}$-$RD_{15}$, $\overline{RD_{15}}$. The data output buffer DOB is supplied with a timing signal $\phi r$ from the timing generator TG. The DOB is selectively enabled by the timing signal $\phi r$, thereby further amplifying the read signals amplified by the sense amplifier SA. The resulting signals are sent to the Y-BUS and the bypass signal path BP as read data.

The data input buffer DIB is configured with 16 unit data input buffer circuits which are coupled to the plurality of pairs of write data lines $WD_0$, $\overline{WD_0}$-$WD_{15}$, $\overline{WD_{15}}$. The data input buffer DIB is supplied with a timing signal $\phi w$ from the timing generator TG. It is selectively brought into its operating state in accordance with the timing signal $\phi w$, whereby the write data items selected by the selector SEL0 are formed into complementary write signals, which are written into a plurality of memory cells coupled to the selected write word line, through the plurality of pairs of write data lines $WD_0$, $\overline{WD_0}$-$WD_{15}$, $\overline{WD_{15}}$.

The timing generator TG forms the timing signals $\phi Sa$, $\phi r$, $\phi w$, $\phi rme$ and $\phi wme$ on the basis of the read control signal R, the write control signal W, the memory enable signal ME and the basic clock signal $\phi 0$ which are generated in the controller CTL.

The selector SEL0 is comprised of 16 unit selector circuits which are coupled with the corresponding 16 unit data input buffer circuits. As indicated above, SEL0 selects the data items on the data bus D-BUS or on the bypass signal path BP and supplies them to the write data port WDP on the basis of the control signals $\phi S0$ and $\phi Sf$ supplied from the controller CTL.

Referring to FIG. 3, the memory array M-ARY is comprised of a plurality of horizontal read word lines $RW_0$-$RW_S$, a plurality of horizontal write word lines $WW_0$-$WW_S$, a plurality of pairs of vertical read data lines $RD_0$, $\overline{RD_0}$-$RD_{15}$, $\overline{RD_{15}}$ and a plurality of pairs of vertical write data lines $WD_0$, $\overline{WD_0}$-$WD_{15}$, $\overline{WD_{15}}$. A lattice of memory cells $MC_{0,0}$-$MC_{15,s}$ are formed at the intersection points between the read/write word lines $RW_0$-$RW_S$/$WW_0$-$WW_S$ and the read/write data lines $RD_0$, $\overline{RD_0}$-$RD_{15}$, $\overline{RD_{15}}$/$WD_0$, $\overline{WD_0}$-$WD_{15}$, $\overline{WD_{15}}$. The memory cells arranged in common rows of the memory array M-ARY have their control terminals coupled to the corresponding read word line and write word line, while the memory cells arranged in common columns have their output nodes and input nodes coupled to the corresponding pair of read data lines and write data lines. The memory cells $MC_{0,0}$-$MC_{15,s}$ are identical in construction to one another. In FIG. 3, therefore, only the memory cell $MC_{0,0}$ is depicted as a detailed circuit diagram. As shown in the Figure, the memory cell $MC_{0,0}$ includes as its principal component a static latch having one pair of complementary MOS (hereinbelow termed "CMOS") inverters which are each constructed of a P-channel type MOSFET Q1, Q3 and an N-channel type MOSFET Q2, Q4 which are respectively coupled between the power source voltage $V_{CC}$ and the ground potential $V_{SS}$. The input terminal of each CMOS inverter is cross-coupled to the output terminal of the opposite CMOS inverter. Memory cell $MC_{0,0}$ has one pair of N-channel type read transfer gate MOSFETs Q5, Q6 and one pair of N-channel type write transfer gate MOSFETs Q7, Q8. The gate electrodes of the read transfer gate MOSFETs Q5, Q6 are both coupled to the read word line $RW_0$, and the corresponding drain and source electrodes of these MOSFETs Q5, Q6 are coupled to the read data lines $RD_0$, $\overline{RD_0}$ respectively. The gate electrodes of the write transfer gate MOSFETs Q7, Q8 are both coupled to the write word line $WW_0$, and the corresponding drain and source electrodes of MOSFETs Q7, Q8 are coupled to the write data lines $WD_0$, $\overline{WD_0}$ respectively.

The unit sense amplifier circuits $SA_0$–$SA_{15}$ are identical in construction to one another. In FIG. 3, therefore, a detailed circuit diagram is shown only for the unit sense amplifier circuit $SA_0$. As shown in the Figure, the unit sense amplifier circuit $SA_0$ is constructed of a CMOS flip-flop circuit which is comprised of P-channel type MOSFETs Q9, Q11, N-channel type MOSFETs Q10, Q12, a P-channel type MOSFET Q13 which is connected between the flip-flop circuit and the node of the power source voltage $V_{CC}$ and whose gate electrode receives a timing signal $\overline{\phi Sa}$ with its phase inverted relative to the timing signal $\phi Sa$, and an N-channel type MOSFET Q14 which is coupled between the flip-flop circuit and the node of the ground potential $V_{SS}$ and whose gate electrode receives the timing signal $\phi Sa$. The unit sense amplifier circuit $SA_0$ is supplied with the timing signal $\phi Sa$ and its inverse $\overline{\phi Sa}$, whereby the MOSFETs Q13 and Q14 are brought into their "on" states. Thus, the potential difference between the pair of read data lines $RD_0$ and $\overline{RD_0}$ is amplified.

The unit data output buffer circuits $DOB_0$–$DOB_{15}$ are similar in construction to one another. Therefore, in FIG. 3, only the circuit $DOB_0$ is illustrated. Although not especially limited, the unit data output buffer circuit $DOB_0$ is configured with clocked inverters $IV_1$ and $IV_2$. Since the circuit arrangements of a clocked inverter and an inverter are well known, the underlying component circuits thereof are not shown in the Figure. However, the operation of the clocked inverter will now be described.

When the timing signal $\phi r$ is at the high level, each of the clocked inverters $IV_1$ and $IV_2$ forms an output signal with its phase inverted relative to the input signal thereof, and when the timing signal $\phi r$ is at the low level, each of the clocked inverters $IV_1$ and $IV_2$ does not form any output signal but rather falls into a high-impedance output state.

Although no special limitation is intended, the clocked inverter $IV_1$ in the unit data output buffer circuit $DOB_0$ is a dummy inverter which is provided in order to mutually equalize parasitic capacitances coupled to the read data lines $RD_0$ and $\overline{RD_0}$. In the read operation of the DRAM, the timing signal $\phi r$ is set at the high level. Thus, the signal transmitted from the selected memory cell to the read data lines $RD_0$, $\overline{RD_0}$ and amplified by the unit sense amplifier circuit $SA_0$ is sent to the Y-BUS (a unit $Y$-$BUS_0$) and the bypass signal path BP (a unit bypass signal path $BP_0$) through the clocked inverter $IV_2$ as well as the read data port RDP (a unit read data port $RDP_0$).

The unit data input buffer circuits $DIB_0$–$DIB_{15}$ are also similar in construction to one another. In FIG. 3, only the circuit $DIB_0$ among these unit data input buffer circuits has its practicable construction illustrated. Although not especially limited, the unit data input buffer circuit $DIB_0$ is configured with clocked inverters $IV_3$ and $IV_5$ and an inverter $IV_4$.

In operation, when the timing signal $\phi w$ is at the high level, each of the clocked inverters $IV_3$ and $IV_5$ forms an output signal with its phase inverted relative to the input signal thereof, and when the timing signal $\phi w$ is at the low level, each of these clocked inverters enter a high impedance state. In the write operation of the DRAM, the timing signal $\phi w$ is set at the high level. Thus, the signal on the data bus D-BUS (a unit $D$-$BUS_0$) or the bypass signal path BP (the unit bypass signal path $BP_0$) as passed through the selector SEL0 (the unit selector circuit $SEL0_0$) as well as the write data port WDP (a unit write data port $WDP_0$) has its phase inverted by the clocked inverter $IV_5$ and is then transmitted to the write data line $\overline{WD_0}$, and it is passed through the inverter $IV_4$ as well as the clocked inverter $IV_3$ and is then transmitted to the write data line $WD_0$, whereby the data item is written into the selected memory cell.

The unit selector circuits $SEL0_0$–$SEL0_{15}$ are also similar in construction to one another. In FIG. 3, a representative circuit is shown only for the unit selector circuit $SEL0_0$. The unit selector circuit $SEL0_0$ is comprised of clocked inverters $IV_6$, $IV_8$ and $IV_9$ and an inverter $IV_7$.

When the timing signal $\phi S0$ is at the high level, the clocked inverter $IV_6$ forms an output signal with its phase inverted relative to the input signal thereof, and when the timing signal $\phi S0$ is at the low level, the clocked inverter $IV_6$ does not form any output signal but rather falls into a high-impedance output state. When a selection control signal $\overline{\phi S0}$, being the phase-inverted signal of the selection control signal $\phi S0$, is at the high level, the clocked inverter $IV_9$ forms an output signal with its phase inverted relative to the input signal thereof, and when the selection control signal $\overline{\phi S0}$ is at the low level, the clocked inverter $IV_9$ does not form any output signal but rather falls into a high-impedance output state. That is, the clocked inverter $IV_6$ is in the high-impedance state when the clocked inverter $IV_9$ forms an output signal, and $IV_6$ forms an output signal when the clocked inverter $IV_9$ is in the high-impedance output state. When the shift control signal $\phi Sf$ is at the high level, the clocked inverter $IV_8$ forms an output signal with its phase inverted relative to the input signal thereof, and when the shift control signal $\phi Sf$ is at the low level, the clocked inverter $IV_8$ does not form any output signal but rather falls into a high-impedance output state. When the timing signal $\phi S0$ is at the high level, the unit selector circuit $SEL0_0$ transmits the signal on the unit data bus $D$-$BUS_0$ to the unit write data port $WDP_0$ of the DRAM. When the timing signal $\phi S0$ is at the low level and the shift control signal $\phi Sf$ is at the high level, the unit selector circuit $SEL0_0$ transmits the signal on the unit bypass signal path $BP_0$ to the unit write data port $WDP_0$ of the DRAM.

The write data port WDP has unit write data ports $WDP_0$–$WDP_{15}$, which are respectively coupled between the corresponding unit data input buffer circuits and unit selector circuits. The read data port RDP has unit read data ports $RDP_0$–$RD0_{15}$, which are respectively coupled to the corresponding unit data output buffer circuits. Symbols $BP_0$–$BP_{15}$, D-$BUS_0$–D-$BUS_{15}$ and Y-$BUS_0$–Y-$BUS_{15}$ denote 1-bit unit signal lines of the bypass signal path BP, D-BUS, and Y-BUS each being configured of 16 bits, respectively. As shown in FIG. 3, the unit signal lines $BP_0$–$BP_{15}$ are respectively coupled between the corresponding unit read data ports and unit selector circuits, the unit signal lines Y-$BUS_0$–Y-$BUS_{15}$ are respectively coupled to the corresponding unit read data ports, and the unit signal lines D-$BUS_0$–D-$BUS_{15}$ are respectively coupled to the corresponding unit selector circuits.

The timing signal $\phi Sa$ (sense amplifier activating signal) is usually held at the low level, but is set to a high level at the point of time at which the operation of selecting the read word line has ended during the read operation state of the DRAM. Likewise, the timing signal $\phi r$ is usually held at the low level, but is set to a high level at the point of time at which the operation of amplifying the read signals by the sense amplifier SA has ended during the read operation state of the DRAM. The timing signal $\phi w$ is usually held at the low level, but is set to a high level at the point of time at which the operation of selecting the write word line has ended during the write operation state of the DRAM. Further, the selection control signal $\phi S0$ is usually held at the low level, but is set to a high level when the signals on the D-BUS are to be written into the DRAM. Lastly, the shift control signal $\phi Sf$ is set to a high level for the shift write operation of the dual-port DRAM.

In FIG. 3, letter L indicates the load means of the read or write data line. The load means L is constructed of a resistance element which is comprised of a MOSFET, or a precharging MOSFET whose gate receives a precharge signal formed by the basic clock signal $\phi 0$ and whose source-drain path is connected between the node of the power source voltage $V_{CC}$ and the read or write data line.

Although not especially limited, the precharging MOSFET is a P-channel type MOSFET. This precharging MOSFET is controlled by the precharge signal which is set to the low level with a predetermined time delay after the basic clock signal $\phi 0$ has been brought to the low level, and which rises to the high level when the basic clock signal $\phi 0$ is brought to the high level. That is, the precharging MOSFETs precharge the read and write data lines in the DRAM during the period of the low level of the precharge signal. Thus, the DRAM can execute the read operation and/or the write operation during one memory cycle of the basic clock signal $\phi 0$. In other words, the DRAM can execute both the read operation of the sampling data and the shift write operation of the sampling data, within one memory cycle.

As shown in FIG. 3, the sampling data of the present invention is comprised of 16 bits.

Figure 4:
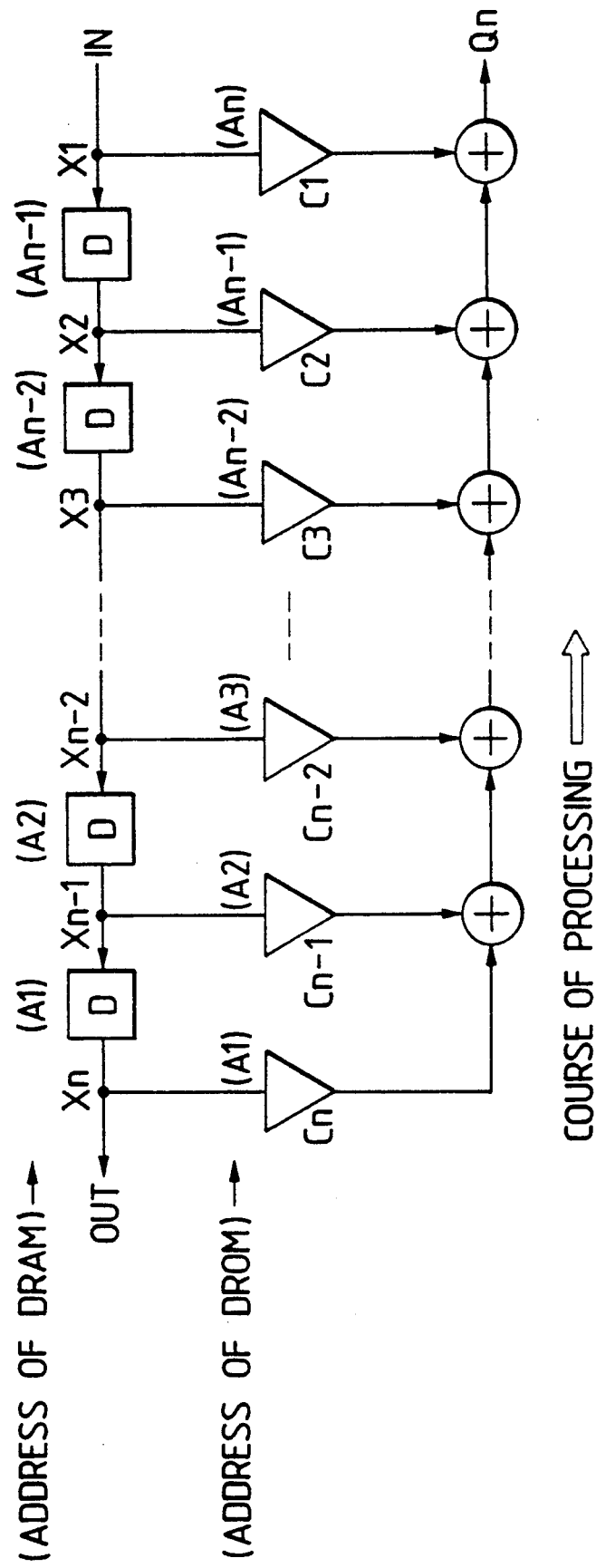
FIG. 4 is a processing flow diagram exemplifying the filter processing of the digital signal processor DSP shown in FIG. 1.

FIG. 4 shows a processing flow diagram example of the multiply-and-add processing executed when a transversal type digital filter is equivalently realized by the digital signal processor DSP of FIG. 1. FIGS. 5(a)–5(o) show timing charts of an example of an operation in the case where the multiply-and-add processing is executed in the digital signal processor DSP of FIG. 1. The outline and features of the multiply-and-add processing of the DSP of this embodiment will be described in conjunction with these Figures.

Referring to FIG. 4, sampling data items which are input from an input node IN at respective sampling intervals are shifted every sampling interval through delay elements D, and they become the sampling data items $X_1$-$X_n$ of individual nodes. These sampling data items are multiplied by corresponding filter coefficients $C_1$-$C_n$ respectively, and the multiplied results are thereafter added in succession, whereby a processed output Qn at the pertinent sampling interval is obtained.

In the DSP, the sampling data items $X_1$-$X_n$ sampled and digitized by an A/D (analog-to-digital) converter circuit not shown are first stored in the corresponding addresses of the DRAM successively. The filter coefficients $C_1$-$C_n$ are set in the corresponding addresses of the DROM beforehand during the manufacture of the digital signal processor DSP.

In the digital signal processor DSP of this embodiment, processing commences with the sampling data item $X_n$ stored first. Although no special limitation is intended, the addresses of the DRAM and the DROM which are assigned to the sampling data items $X_1$-$X_n$ and the filter coefficients $C_1$-$C_n$ respectively, increase one by one in conformity with the direction of the processing. Accordingly, in a case where the shift write operation of the DRAM is necessary at each multiply-and-add processing step, the sampling data item $X_{(Ai)}$ which is read out of the address $A_i$ of the DRAM is supplied with the filter coefficient $C_{(Ai)}$ which is read out of the corresponding address $A_i$ of the DROM, while at the same time, it is written into the directly preceding address $A_{(i-1)}$ of the DRAM, thereby being equivalently delayed. The processing direction is different from that of the prior art processing flow diagram shown in FIG. 11, but the result obtained is essentially the same.

Next, arithmetic operation of the digital signal processor DSP will be described.

In the digital signal processor DSP, the multiply-and-add processing in each sampling period is started by setting initial address values in the read address pointer RAP, write address pointer WAP and ROM address pointer ROP. The initial address values of the read address pointer RAP and the ROM address pointer ROP are set identically and the initial address value of the write address pointer WAP is set to an address directly preceding the initial address value set in the read address pointer RAP and the ROM address pointer ROP. As indicated above, these addresses are independently incremented by the respective address pointers as the multiply-and-add processing progresses. Owing to the countup processing, the addresses of the DRAM and the DROM are successively updated, and the processing flow in FIG. 4 proceeds automatically.

The count values of the read address pointer RAP and the ROM address pointer ROP are initially set to $A_1$. Thus, the sampling data item corresponding to the address $A_1$, namely, the sampling data item $X_n$ is read out of the read data port RDP of the DRAM and is delivered through the Y-BUS to an input terminal of the multiplier unit MULT. Simultaneously, the filter coefficient $C_n$ is read out of the corresponding address of the DROM, namely, the address $A_1$ and is delivered through the X-BUS and SEL1 to an input terminal of the multiplier unit MULT. The sampling data item $X_n$ and the filter coefficient $C_n$ are multiplied by the multiplier unit MULT, and the processed result is thereafter delivered through SEL3 to an input terminal of the arithmetic logic unit ALU.

The ALU delivers the processed result to the accumulators ACCA and ACCB without subjecting it to any processing.

Regarding the sampling data item $X_n$, the shift write operation of the DRAM is not required in the processing flow of FIG. 4. Therefore, only the read operation of the sampling data item $X_n$ is executed, and the shift write operation thereof is not executed.

The operation of the digital signal processor DSP in the case where the shift write operation of the DRAM is required, namely where the read data items of the DRAM are the sampling data items $X_{n-1}-X_1$, will be described with reference to FIGS. 5(a)-5(o). Since the individual operations of the digital signal processor DSP for the sampling data items $X_{n-1}-X_1$ are similar, the sampling data item $X_{(Ai)}$ will be referred to.

In FIG. 5(a), each of symbols $m_1$ and $m_2$ denote one memory cycle of the DRAM.

In FIGS. 5(a)-5(o), in the memory cycle $m_1$, the memory enable signal ME rises to the high logic level before the rise of the basic clock signal $\phi 0$ to the high logic level, whereby the DRAM is enabled. Also, since the read control signal R rises to the high level before the rise of the basic clock signal $\phi 0$, the DRAM performs the read operation in the memory cycle $m_1$.

In memory cycle $m_1$, as shown in FIGS. 5(e)-5(g), the count values of the read address pointer RAP and the ROM address pointer ROP are set to $A_1$, and the value of the write address pointer WAP is set to $A_{i-1}$. Thus, the address pointers RAP ROP and WAP supply the read DRAM, DROM and write DRAM with the address signals $A_i$, $A_i$ and $A_{i-1}$, respectively.

In the DRAM, the read word line corresponding to the address $A_i$ is selected by the read decoder R-DCR because the memory enable signal ME and the read control signal R rise to the high logic levels at the rise of the basic clock signal $\phi 0$. When the select operation has ended, the timing signal $\phi$Sa transitions to the high logic level, thus enabling the sense amplifier SA. The read signals, which are delivered from the plurality of memory cells coupled to the selected read word line to the corresponding pairs of read data lines, are amplified by the corresponding unit sense amplifier circuits in the sense amplifier SA. Subsequently, the timing signal $\phi$r transitions to the high logic level. Thus, the sampling data item $X_{(Ai)}$ corresponding to the address $A_i$ as amplified by the sense amplifier SA is read out and is delivered through the Y-BUS to an input terminal of the multiplier unit MULT.

At the same time, the filter coefficient $C_{(Ai)}$ is read out of the corresponding address (Ai) of the DROM and is delivered through the X-BUS and the selector SEL1 to another input terminal of the multiplier unit MULT.

Figure 5:
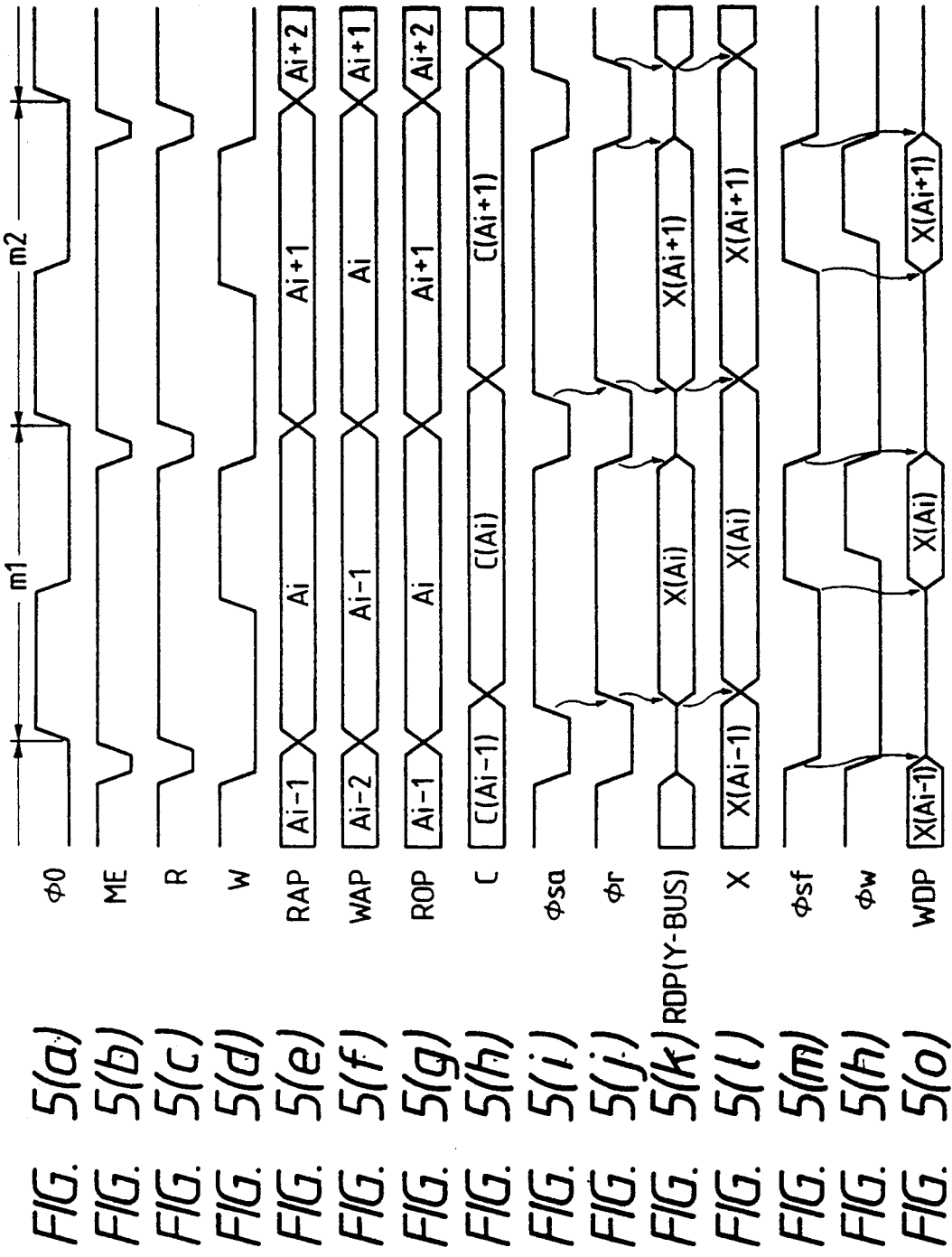
FIGS. 5(a)–5(o) are timing charts exemplifying the operation of the digital signal processor DSP shown in FIG. 1.

The multiplier unit MULT holds the delivered sampling data item $X_{(Ai)}$ and filter coefficient $C_{(Ai)}$ in holding circuits not shown, until the next sampling data item $X_{(Ai+1)}$ and filter coefficient $C_{(Ai+1)}$ are received FIGS. 5(1) and 5(h)). Then, the multiplier unit MULT multiplies the sampling data item $X_{(Ai)}$ and the filter coefficient $C_{(Ai)}$ and thereafter delivers the processed result (product) to an input terminal of the arithmetic logic unit ALU through the selector SEL3.

The other input terminal of the arithmetic logic unit ALU is supplied with the content of the accumulators ACCA and ACCB, which contain the result of the multiply-and-add processing from the last cycle. The arithmetic logic unit ALU further adds the current product of the sampling data item $X_{(Ai)}$ and the filter coefficient $C_{(Ai)}$ with the result of the multiply-and-add processing accumulated from prior cycles. The sum thereby obtained is added to the accumulators ACCA and ACCB again.

Meanwhile, at the same time that the sampling data item $X_{(Ai)}$ delivered from the read data port RDP of the DRAM is supplied to the multiplier unit MULT through the Y-BUS, it is supplied to the selector SEL0 through the bypass signal path BP. When the shift control signal $\phi$Sf rises to the high level, the selector SEL0 transmits the sampling data item $X_{(Ai)}$ to the write data port WDP of the DRAM. As indicated above, the write address port WAP' is supplied with the address $A_{i-1}$ from the write address pointer WAP.

The DRAM performs the write operation in the latter half of the memory cycle $m_1$ when the write control signal W rises to the high logic level before the fall of the basic clock signal $\phi 0$. More specifically, in the DRAM, when the operation of the write decoder W-DEC for selecting the write word line corresponding to the address $A_{i-1}$ has ended, the timing signal $\phi$w rises to the logic high level, and the sampling data item $X_{(Ai)}$, transmitted to the write data port WDP, is written into one of the selected memory cells through the data input buffer DIB. The write operation (the shift write operation) is thus carried out in parallel with the read operation of the sampling data item $X_{(Ai)}$ from the read data port RDP. In other words, the operation of reading out the sampling data item $X_{(Ai)}$ and the operation of writing the sampling data item $X_{(Ai)}$ just read out, into the address $A_{i-1}$ are simultaneously executed in one memory cycle of the DRAM.

In this manner, as the addresses are updated, the operations of reading out the sampling data items and the filter coefficients and the operations of multiplying and adding them are repeatedly executed in the sequence from the sampling data item $X_n$ sampled first, to the sampling data item $X_1$ sampled last. Regarding the sampling data items $X_{n-1}-X_1$ read out, the operations of writing them into the next addresses are also executed in parallel with the read operations. Thus, in the digital signal processor DSP, the following filter processing for each sampling period is equivalently performed:

$$Q_n \sum_{i=1}^{n} X_i \cdot C_i$$

Figure 11:
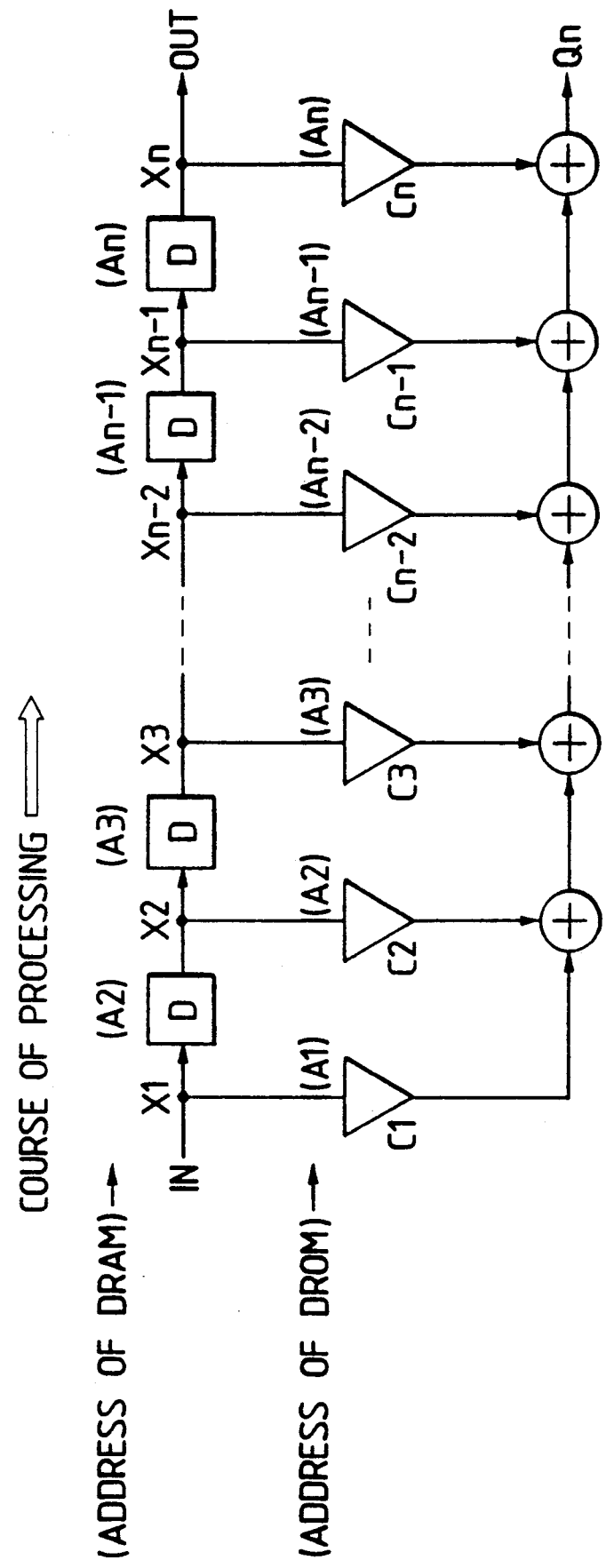

A processing flow equivalent to the processing flow in FIG. 4 or FIG. 11 is thus realized.

The filter processing indicated by the above formula is repeatedly executed at each respective sampling period, and signal data formed as the result of the arithmetic processing is output to the exterior of the digital signal processor DSP through the external terminals D0-D15 or the external terminal D0 coupled to the E-BUS. In this way, the digital signal processor DSP of this embodiment equivalently functions as a transversal type digital filter.

Figure 6:
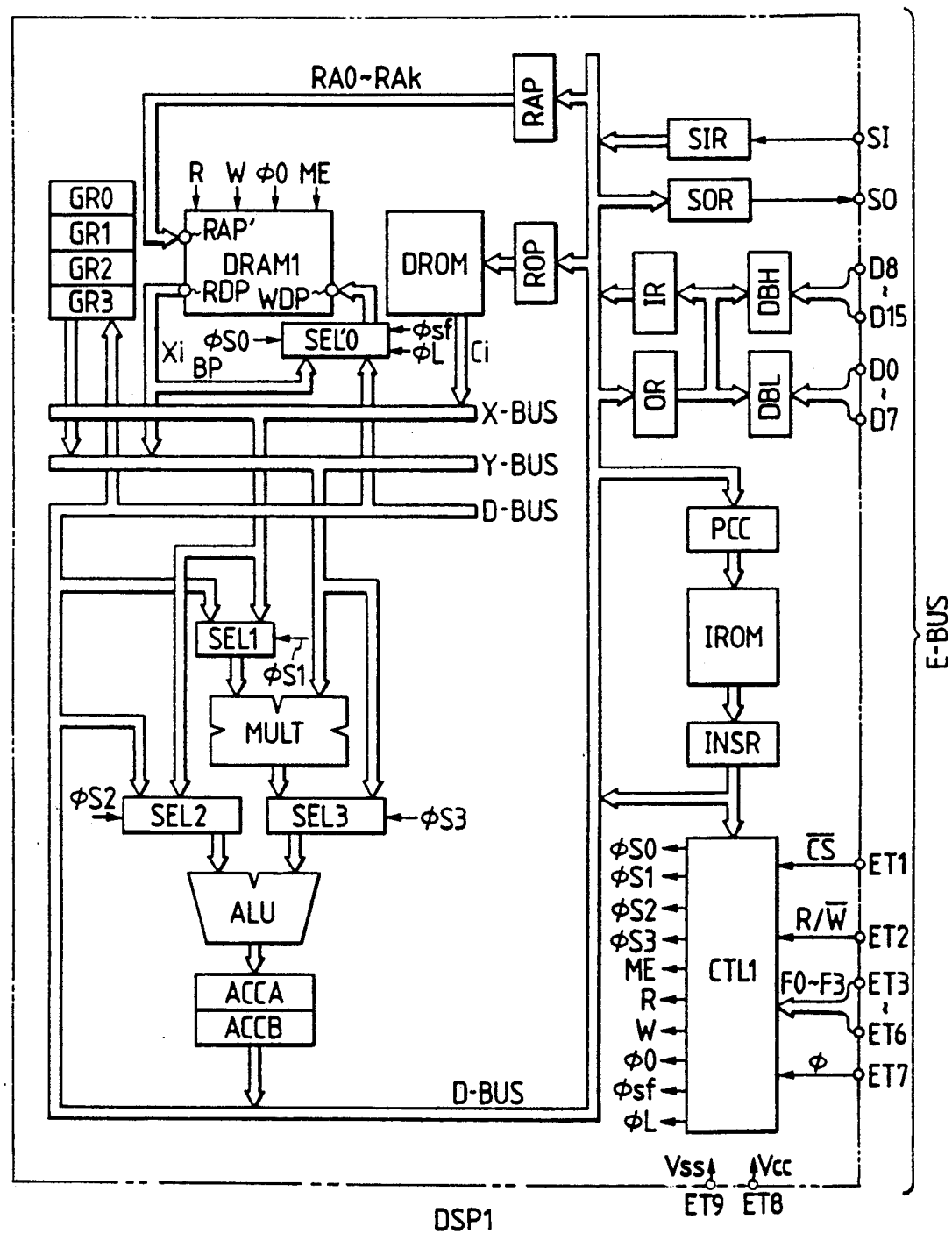
FIG. 6 is a block diagram showing the second embodiment of the digital signal processor to which the present invention is applied.

FIG. 6 shows the second embodiment of the digital signal processor to which the present invention is applied.

The digital signal processor DSP1 in FIG. 6 will be described with note taken of the points of difference from the digital signal processor DSP of FIG. 1.

In the digital signal processor DSP1 shown in FIG. 6, DRAM1 replaces the DRAM, CTL1 replaces CTL, and SEL'0 replaces the SEL0 of FIG. 1. However, the write address pointer WAP is not provided in the digital signal processor DSP1.

The DRAM1 is constructed of a dual-port RAM similar to the DRAM. The DRAM1 differs from the DRAM in that the write address port WAP' is not provided. The result of the selection of a predetermined read data line is held within the DRAM1 and a predetermined write word line is selected on the basis of the held selection result.

The SEL'0 differs from the SEL0 in that SEL'0 includes a holding circuit which holds signals on the bypass signal path BP, namely, read data items read from the DRAM1. The hold operation of the holding circuit is controlled by a control signal $\phi L$.

The DRAM1 and the SEL'0 will be described in detail later with reference to FIG. 7 and FIG. 8, respectively.

The controller CTL1 differs from the controller CTL in that, besides the various signals $\phi S0$–$\phi S3$, ME, R, W, $\phi 0$ and $\phi Sf$, the controller CTL1 forms the control signal $\phi L$ on the basis of certain microinstructions held in the instruction register INSR and supplied to the selector SEL'0.

Figure 7:
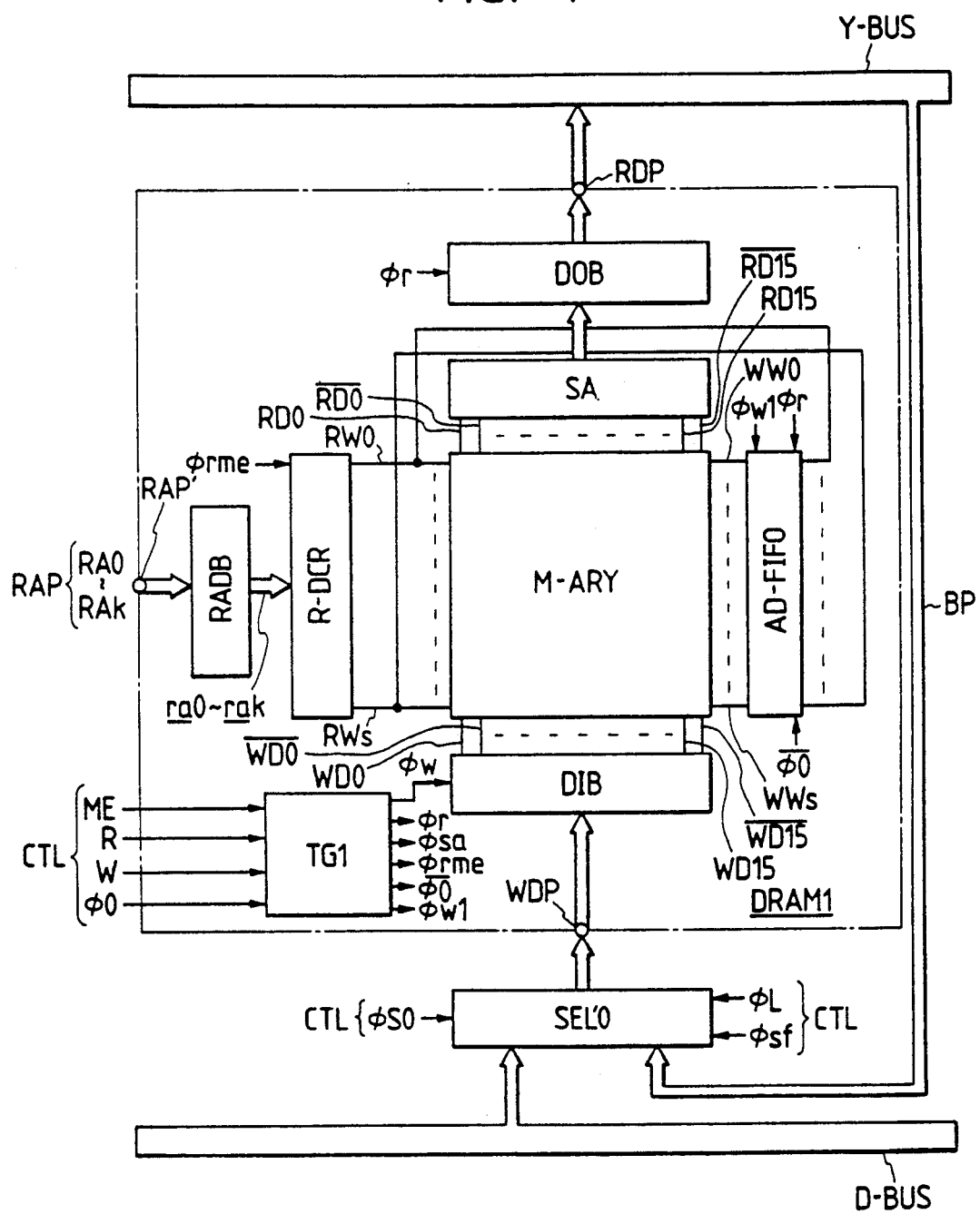
FIG. 7 is a block diagram showing an example of a data RAM DRAM1 which is built in the digital signal processor DSP1 of FIG. 6.

FIG. 7 is a block diagram showing an example of the DRAM1.

Referring to FIG. 7, the DRAM1 differs from the DRAM of FIG. 2 in that the write address port WAP', write address buffer WADB and write decoder W-DCR are not provided and are replaced with an address first-in first-out register AD-FIFO. Also, the timing generator TG is replaced with a timing generator TG1.

The AD-FIFO has its input ports coupled to the read word lines $RW_0$–$RW_S$, and has its output ports coupled to the write word lines $WW_0$–$WW_S$. The AD-FIFO is supplied by the timing generator TG1 with the timing signal $\phi r$, a timing signal $\phi w1$ whose phase is the same as that of the write control signal W and which is synchronous with the control signal W, and a timing signal $\overline{\phi 0}$ whose phase is inverted relative to that of the basic clock signal $\phi 0$ and which has a predetermined delay time relative to the basic clock signal $\phi 0$, When the timing signal $\phi r$ is at the high logic level and the timing signal $\overline{\phi 0}$ rises to its high logic level, the AD-FIFO holds the output signals of the read decoder R-DCR through the read word lines $RW_0$–$RW_S$ synchronously with the rise of the timing signal $\overline{\phi 0}$. That is, under the read operation state of the DRAM1, the AD-FIFO holds the selection information of the read decoder R-DCR in synchronism with the rise of the timing signal $\overline{\phi 0}$ to the high logic level. When the timing signal $\phi w1$ is at its high level while the timing signal $\overline{\phi 0}$ falls to its low logic level, the AD-FIFO supplies the write word lines $WW_0$–$WW_S$ with signals which are held therein until the next rise of the timing signals $\overline{\phi 0}$. That is, under the write operation state of the DRAM1, the AD-FIFO delivers the selection information of one of the read word lines to the write word lines, whereby the write word line having the same address as that of the read word line is brought into the selected state (to the high level), and the other write word lines remain unselected (at the low level).

The timing generator TG1 differs from the timing generator TG. Although the timing generator TG1 does not form the timing signal $\phi wme$, it forms the timing signal $\phi w1$ on the basis of the memory enable signal ME and the write control signal W and supplies this timing signal to the AD-FIFO, TG1 forms the timing signal $\overline{\phi 0}$ on the basis of the basic clock signal $\phi 0$ and supplies this timing signal to the AD-FIFO, and it supplies the timing signal $\phi r$, not only to the data output buffer DOB, but also to the AD-FIFO.

Figure 8:
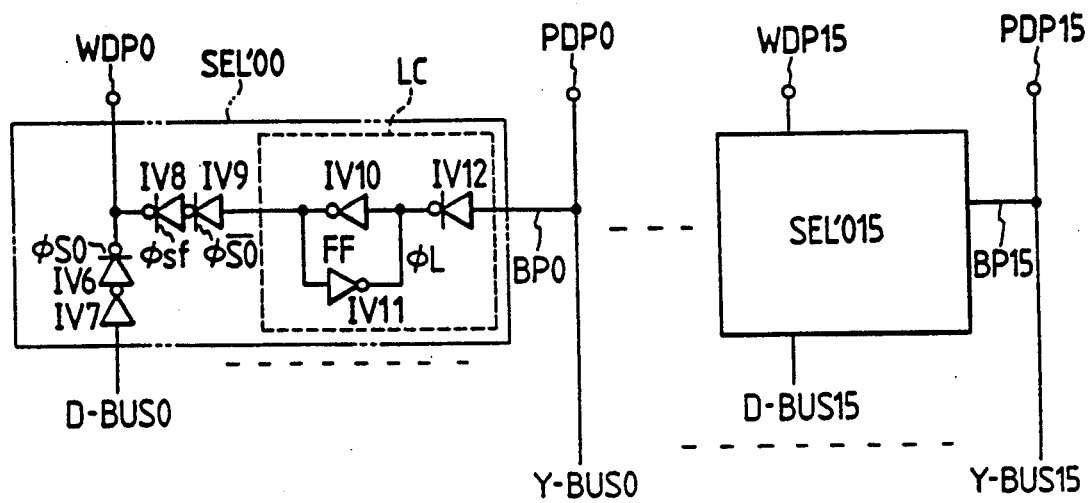
FIG. 8 is a detailed diagram showing an example of a busy selector SEL'0 which is built in the digital signal processor DSP1 of FIG. 6.
Figure 10:
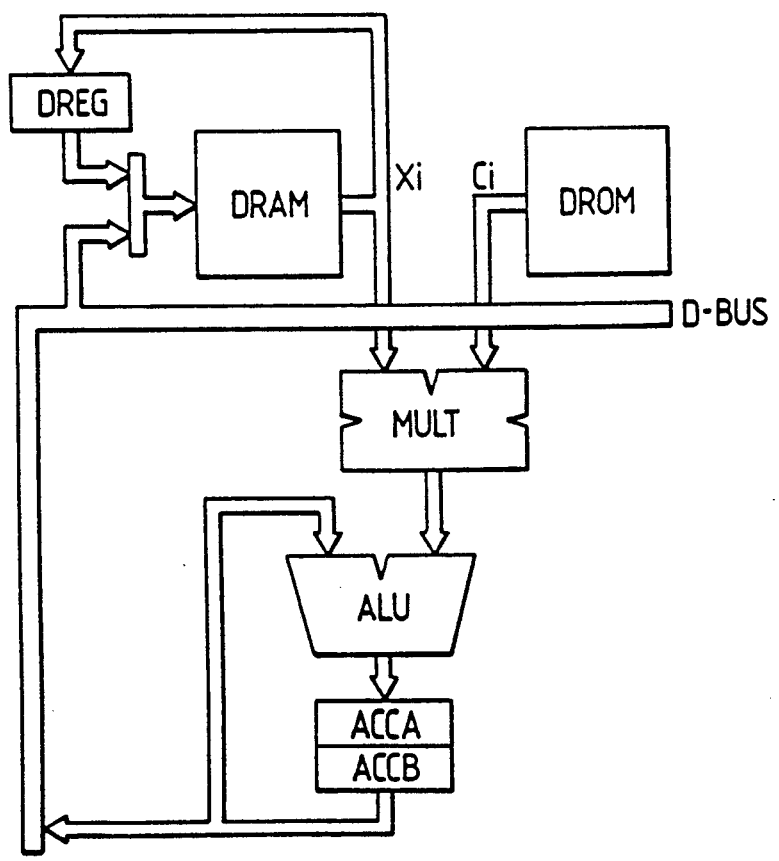
FIG. 10 is a partial block diagram showing an example of a digital signal processor of the prior art; and, FIG. 11 is a processing flow diagram showing an example of the filter processing of the digital signal processor depicted in FIG. 10.

FIG. 8 is a detailed diagram showing an example of the selector SEL'0.

Referring to FIG. 8, the selector SEL'0 is configured of unit selector circuits $SEL'0_0$–$SEL'0_{15}$ similar to the selector SEL0. Since the unit selector circuits $SEL'0_0$–$SEL'0_{15}$ are of similar construction, only the practicable circuit arrangement of the unit selector circuit $SEL'0_0$ is representatively illustrated.

The unit selector circuit $SEL'0_0$ differs from the unit selector circuit $SEL0_0$ in including, not only the inverters $IV_6$–$IV_9$, but also the holding circuit LC which is coupled between the input node of the clocked inverter $IV_9$ and the unit bypass signal path $BP_0$.

The holding circuit LC is configured of a clocked inverter $IV_{12}$, and a flip-flop FF comprised of inverters $IV_{10}$ and $IV_{11}$. In the holding circuit LC, when the timing signal $\phi L$ is at the high logic level, the flip-flop FF holds the signal on the unit bypass signal path $BP_0$ as supplied with the phase thereof inverted through the inverter $IV_{12}$, and it further inverts the phase of the signal into the original phase thereof, whereby the signal on the unit bypass signal path $BP_0$ is supplied to the input node of the clocked inverter $IV_9$.

FIGS. 9(a)–9(o) show timing charts of an example of an operation in the case where the multiply-and-add processing in FIG. 4 is executed in the digital signal processor DSP1 of FIG. 6.

Described next is the operation of the digital signal processor DSP1 as it executes the processing flow in FIG. 4. In the description, the arithmetic processing of sampling data read out of the DRAM1 shall be briefly explained because it is similar to that of the DSP in FIG. 1. The read operation and shift write operation of the DRAM1 shall be explained in detail.

In the DSP1, when the count value of the read address pointer RAP is set to an address $A_1$, the sampling data item $X_n$ corresponding to the address $A_1$ is read from the read data port RDP of the DRAM1 and is processed according to predetermined algorithm. In the DRAM1, the AD-FIFO holds the output signals of the read decoder R-DCR conforming to the address $A_1$, at the rise of the timing signal $\phi 0$ in the memory cycle of the operation of reading out the sampling data item $X_n$, because the timing signal $\phi r$ is at the high level. As stated before, regarding the first sampling data item $X_n$, the shift write operation is not required and is not executed.

Subsequently, in case where the address of the read address pointer RAP is $A_2$, the sampling data item $X_{n-1}$ corresponding to the address $A_2$ is read from the read data port RDP and is processed according to a predetermined algorithm similar to the sampling data item $X_n$. In the memory cycle which reads sampling data item $X_{n-1}$, the AD-FIFO holds the output signals of the read decoder R-DCR conforming to the address $A_1$. Further, the holding circuit LC within the selector SEL'0 holds the sampling data item $X_{n-1}$ in response to the rise of the timing signal $\phi L$. Under this state, the AD-FIFO holds the selection information items of the addresses $A_1$ and $A_2$.

Described next is the case where the sampling data items $X_{n-2}$-$X_1$ are read from the DRAM1. In the DRAM1, the shift write operation for the sampling data items $X_{n-1}$-$X_2$ is executed in parallel with the readout of the sampling data items $X_{n-2}$-$X_1$. In addition, the individual read operations for the sampling data items $X_{n-2}$-$X_1$ are the same, and the sampling data item $X_{(Ai)}$ among these sampling data items $X_{n-2}$-$X_1$ will be representatively explained with reference to FIGS. 9(a)-9(o).

In FIGS. 9(a)-9(o), in the memory cycle $m_1$, the memory enable signal ME rises to the high logic level before the rise of the basic clock signal $\phi 0$, thereby enabling the DRAM1. Also, since the read and write control signals R, W rise to the high level before the rise of the basic clock signal $\phi 0$, the DRAM1 performs both the read and write operations.

As shown in FIG. 9(e), the read address pointer RAP is loaded with the address $A_1$. Accordingly, the read word line corresponding to the DRAM1 address $A_i$ is selected by the read decoder R-DCR. When the select operation has ended, the timing signals $\phi Sa$ and $\phi r$ rise to the high level in succession, and the sampling data item $X_{(Ai)}$ corresponding to the address $A_i$ is output to the Y-BUS. The sampling data item $X_{(Ai)}$ is then subjected to the predetermined processing by the multiplier unit MULT and the arithmetic logic unit ALU.

In the latter half of the memory cycle $m_1$, the timing signal $\phi r$ rises to the high logic level before the rise of the timing signal $\phi 0$ so that the output signals of the read decoder R-DCR conforming to the address $A_i$ are held by the first stage of the AD-FIFO, and the sampling data item $X_{(Ai)}$ read from the DRAM1 is held in the holding circuit LC within the selector SEL'0 through the bypass signal path BP in response to the rise of the timing signal $\phi L$.

Further, in the memory cycle $m_1$, the output signal of the read decoder R-DCR conforming to the address $A_{i-2}$, which was stored in the AD-FIFO during the memory cycle two cycles before memory cycle $m_1$, are output from the AD-FIFO to the write word lines $WW_0$-$WW_S$ during the low logic level of the timing signal $\overline{\phi 0}$, because the timing signal $\phi w1$ is at the high logic level when the timing signal $\overline{\phi 0}$ falls. Thus, among the write word lines $WW_0$-$WW_S$, the write word line corresponding to the address $A_{i-2}$ is exclusively selected by the AD-FIFO. The other write word lines remain unselected.

In the first half of the memory cycle $m_1$, the shift control signal $\phi Sf$ rises to the high logic level, whereby the sampling data item $X_{(Ai-1)}$ previously stored in the holding circuit LC during the last memory cycle before memory cycle $m_1$ is supplied to the write data port WDP. Then, in response to the rise of the timing signal $\phi w$, the sampling data item $X_{(Ai-1)}$ is written into the memory cell corresponding to the address $A_{i-2}$ selected by the output signals of the AD-FIFO. Thus, the DRAM1 operations of reading out the sampling data item $X_{(Ai)}$ corresponding to the address $A_i$ and writing the sampling data item $X_{(Ai-1)}$ into the address $A_{i-2}$ are carried out in parallel within one memory cycle.

In the DRAM1, the read operations of the sampling data items $X_{n-2}$-$X_1$ and the shift write operations of the sampling data items $X_{n-1}$-$X_2$ are repeatedly executed. The shift write operation of the sampling data item $X_1$ is executed in a later memory cycle. In this way, the DSP1 is capable of realizing a processing flow equivalent to that of FIG. 4 or FIG. 11 similar to the processor DSP, and thereby functions as, for example, a transversal type digital filter.

As thus far described, the digital signal processor of each embodiment comprise a multiplier unit MULT, an arithmetic logic unit ALU, a data RAM and a data ROM, and have a multiply-and-add processing function for equivalent digital filter realization. In each embodiment, the data RAM is constructed of a dual-port RAM design, having two dedicated data ports, namely, a read data port RDP and a write data port WDP. In addition, a bypass signal path BP for directly transferring items of sampling data without the intervention of any internal bus is provided between the read data port RDP and the write data port WDP. Owing to these features, in the digital signal processor DSP or DSP1 of each embodiment, the read operation required for multiply-and-add processing and the write operation (the shift write operation) required for the shift processing of the sampling data items are simultaneously executed in one memory cycle of the data RAM of the DSP or DSP1. Consequently, the operations of reading and writing the data items are, in effect, performed in parallel, within one memory cycle. The processing time period needed is therefore remarkably reduced compared with the prior art whereby the read cycle and write cycle of a data RAM are separately executed, each requiring one memory cycle. Further, the sampling data items are processed in the sequence in which they are received thereby eliminating the need for data holding means such as a delay registers, thus reducing the quantity of hardware necessary to implement a digital signal processor.

In the case the application of the foregoing embodiments to a digital signal processor having a multiply-and-add function for filter processing, the following advantageous functional effects are attained:

(1) Because the data RAM of the digital signal processor is constructed of a dual-port design and a bypass signal path is provided for directly transferring data items without the intervention of any bus is extended between the two data ports of the data RAM, and because sampling data items are processed in the order in which they are received, the read operation necessary for the multiply-and-add processing and the write operation of sampling data items read currently or in the previous read memory cycle, can be executed in a shorter machine cycle.

(2) Since the two RAM access ports provided are of the dual-port design, the construction of each port is simplified while reducing the quantity of hardware required, for example, no sense amplifier is required on the write port side.

(3) Delay register or the like for buffering the sampling data items need not be provided. Therefore, the quantity of hardware required of the digital signal processor can be reduced.

(4) The read processing and write processing of the data RAM can be simultaneously performed within one machine cycle. Therefore, the number of dynamic steps of the digital signal processor can be reduced.

(5) Since the data RAM is configured of the dual-port design, the speed of the arithmetic processing of the digital signal processor (except the multiply-and-add processing) can be increased.

(6) Because of the above, the overall processing capability of the digital signal processor is enhanced, while reducing the cost thereof.

Although the invention has been particularly described in conjunction with the above embodiments, it is not thereby restricted, but rather can be variously altered without departing from the scope thereof. By way of example, in FIG. 1 and FIG. 6, the data RAM of the digital signal processor need not have its two data ports dedicated to the read data port RDP and the write data port WDP, but may well have a multiport construction including three or more access ports. Also, the bypass signal path BP which is extended between the read data port RDP and the write data port WDP may well be formed through an internal bus. The internal bus configuration of the digital signal processor is not restricted to that of each embodiment.

In FIG. 1, the write address pointer WAP can be supplied addresses on the basis of the count value of the read address pointer RAP, so that it can be replaced with, for example, a "minus one" circuit which subtracts one from the count value of the RAP. In FIGS. 5(a)–5(o) or FIGS. 9(a)–9(o), various aspects of performance can be affected through the modification of the timing of the read and write operations in each memory cycle. In FIG. 4, it is also possible to adopt a method in which, as the addresses of the data RAM fill, more recent sampling data items are successively assigned higher addresses from the sampling data item $X_1$ accepted last, and the arithmetic processing proceeds along toward decreasing addresses. In this case, and allowing $A_1$ to denote the count value of the read address pointer RAP, the count value of the write address pointer WAP becomes $A_{i+1}$. Effects similar to those obtained through the use of data RAM having a plurality of access ports can be obtained using a memory which includes two access ports and two memory maps instead of a dual-port RAM which shares a memory map. In this case, it is necessary to establish a construction in which for every sampling period the respective access ports are restricted to reading and writing, and page limitations imposed to alternately switch the memory maps connected to the ports, whereby data items can be simultaneously read or written. Further, the block arrangement of the digital signal processors shown in FIG. 1 and FIG. 6 can be modified to affect various aspects of performance. In addition, although the example employs the static type RAM, the data RAM may be constructed using the dynamic type RAM as well.

In the foregoing, the invention has been chiefly described in relation to applications involving a digital signal processor having a multiply-and-add processing function necessary for filter processing. However, the present invention is not restricted thereto, but it is also applicable to, for example, a single-chip the CODED (coder-decoder) or MODEM (modulator-demodulator) which includes such a digital signal processor. The present invention is applicable to digital signal processors which perform a multiply-and-add processing function along with shift processing, and digital devices which include such digital signal processors.

What is claimed is:

1. A digital signal processor comprising:
    arithmetic means for executing arithmetic operations;
    control means for controlling the arithmetic operations of said arithmetic means; and,
    memory means including first selection means, second selection means, a memory array having a plurality of first word lines, second word lines, pairs of first data lines, pairs of second data lines, memory cells, and a transfer means for transferring data out of the memory array;
    wherein each of said memory cells is coupled to one of said first word lines, to one of said second word lines, to a pair of said first data lines pairs and to a pair of said second data lines pairs;
    wherein said first selection means is coupled to said plurality of first word lines and selects one first word line from said plurality of first word lines,
    wherein said second selection means is coupled to said plurality of second word lines and selects one second word line from said plurality of second word lines,
    wherein said transfer means is coupled to said pairs of first and second data lines and transfers the data from first memory cells coupled to said selected one first word line to second memory cells coupled to said selected one second word line in a substantially identical time period as a transfer of the data to the arithmetic means from the memory means, and wherein the first and second memory cells comprise different memory cells.

2. The digital signal processor according to claim 1, wherein the transfer means includes means for reading out the data from the first of the memory cells at the selected one first word line and for writing the data at the second of the memory cells at the selected second word line in an identical single memory cycle.

3. The digital signal processor according to claim 2, wherein a cycle of data arithmetic operations of said arithmetic means comprises the identical single memory cycle.

4. The digital signal processor according to claim 2, wherein said digital signal processor is formed on a single chip.

5. In a digital signal processor having a random access memory with addressable read word lines and addressable write word lines for respective selection of a read word line and a write word line, and having read data lines and write data lines provided to respectively read data from and write data to the random access memory in accordance with a plurality of control signals generated by a controller, a method for implementing a data read, a data write and a data shift operation within a single machine cycle comprising the steps of:
    a) during a first machine cycle: reading first data from the random access memory at a first address and transferring the first data to a read data port;
    writing the first address into a first-in-first-out shift address buffer;
    transferring the first data from the read data port to a delay holding circuit through a bypass path;
    b) during a second machine cycle: reading second data from the random access memory at a second address and transferring the second data to the read data port;
    writing the second address into the first-in-first-out shift address buffer;
    transferring the second data from the read data port to the delay holding circuit through the bypass path;
    outputting the first address from the first-in-first-out shift address buffer to the random access memory;

writing the second data from the delay holding circuit to a write data port; and writing the second data from the write data port to the random access memory at the first address whereby the data read, data write, and data shift of the second data from the second address to the first address occurs within the second machine cycle.

6. A digital signal processor comprising:

arithmetic means for executing arithmetic operations;

control means for controlling the arithmetic operations of said arithmetic means; and, memory means including first selection means, second selection means, and a memory array having a plurality of first word lines, second word lines, first data lines, second data lines, memory cells and a transfer means for transferring data out of the memory array, wherein each of said memory cells is coupled to one of said first word lines, to one of said second word lines, to one of said first data lines, and to one of said second data lines, wherein said first selection means is coupled to said plurality of first word lines and selects one from said plurality of first word lines, wherein said second selection means is coupled to said plurality of second word lines and selects one from said plurality of second word lines;

wherein said transfer means is coupled to said plurality of first and second data lines and transfers the data from first memory cells coupled to said one selected first word line to second memory cells coupled to said selected one second word line and wherein the first and second memory cells are different, and, wherein the processor includes means for reading out the data from the first memory cells in a first time period and means for writing the data transferred by said transfer means into the second memory cells in a second time period which overlaps with the first period.

7. The digital signal processor according to claim 6 wherein said digital signal processor is formed on a single chip.

8. A digital signal processor comprising:

arithmetic means for executing arithmetic operations;

control means for controlling the arithmetic operations of said arithmetic means; and, memory means including first selection means, second selection means, a memory array having a plurality of first word lines, second word lines, first data lines, second data lines and a plurality of storage means, and a transfer means for transferring data out of the memory means, wherein said first selection means is coupled to said plurality of first word lines and selects one from said plurality of first word lines, wherein said second selection means is coupled to said plurality of second word lines and selects one from said plurality of second word lines, wherein each of said storage means is coupled to one of said first word lines, to one of said second word lines, to one of said first data lines and to one of said second data lines, wherein said transfer means is coupled to said first data lines and to said second data transfers the data from first storage means coupled to the selected first word line to second storage means coupled to the selected second word line, wherein the first and second storage means are different, and wherein a read operation for reading out the data from the first storage means coupled to the selected first word line and a write operation for writing the data to the second storage means coupled to the selected second word line are executed by said transfer means and wherein the write operation overlaps with the read operation.

9. The digital signal processor according to claim 8 wherein said first and second storage means comprise a plurality of memory cells.

10. The digital signal processor according to claim 9, wherein said digital signal processor is formed on a single chip.

11. A digital signal processor comprising:

memory means including a plurality of first word lines, second word lines, first data line pairs, second data line pairs and memory cells, wherein each of the memory cells is coupled to one of the first word lines, to one of the second word lines, to one pair of the first data line pairs and to one pair of the second data line pairs;

said memory means further including first selecting means for selecting one of said plurality of first word lines, second selecting means for selecting one of said plurality of second word lines and at least two ports, wherein a first port stores data read from first memory cells coupled to the selected one of said plurality of first word lines and a second port stores data to be written to second memory cells which are coupled to the selected one of said plurality of second word lines, wherein the first and second memory cells are different;

read means coupled to said first data line pairs for reading data from the first memory cells coupled to the selected one of said plurality of first word lines and transferring the data to the first port;

write means coupled to said second data line pairs for writing data from the second port to the second memory cells coupled to the selected one of said plurality of second word lines;

arithmetic means, including a multiplier and an arithmetic logic unit, for performing a multiply-and-add operation of the data provided to the first port;

transfer means for transferring data from the first port to the second port and the arithmetic means, wherein the transfer means comprise means for simultaneously transferring data from the first port to the second port and the arithmetic means; and, control means for controlling the read means, the write means, and the transfer means, the control means outputting control signals for controlling the read means, write means, and transfer means so that a read operation for reading out the data, a write operation for writing the data and the multiply-and-add operation of the data provided to the first port are executed in overlapping time periods.

* * * * *

UNITED STATES PATENT AND TRADEMARK OFFICE
CERTIFICATE OF CORRECTION

PATENT NO. : 5,293,611
DATED : March 8, 1994
INVENTOR(S) : Hirofumi Wada

It is certified that error appears in the above-indentified patent and that said Letters Patent is hereby corrected as shown below:

Claim 8, column 22, line 2, after "second data" insert --lines and--.

Signed and Sealed this

Twenty-eighth Day of June, 1994

Attest:

BRUCE LEHMAN

Attesting Officer                Commissioner of Patents and Trademarks